US006448554B1

(12) United States Patent
Aono et al.

(10) Patent No.: US 6,448,554 B1
(45) Date of Patent: Sep. 10, 2002

(54) ION SCATTERING SPECTROMETER

(75) Inventors: Masakazu Aono, Tokyo; Takane Kobayashi, Wako, both of (JP)

(73) Assignee: The Institute of Physical and Chemical Research (Riken), Wako (JP)

( * ) Notice: Subject to any disclaimer, the term of this patent is extended or adjusted under 35 U.S.C. 154(b) by 0 days.

(21) Appl. No.: 09/321,853

(22) Filed: May 28, 1999

(30) Foreign Application Priority Data

Jun. 1, 1998 (JP) ........................................ 10-151245

(51) Int. Cl.[7] ........................ H01J 37/252; H01J 49/44
(52) U.S. Cl. ........................................................ 250/309
(58) Field of Search ............................ 250/309, 441.11

(56) References Cited

U.S. PATENT DOCUMENTS 2,899,556 A * 8/1959 Schopper et al. ...... 250/441.11
5,347,126 A * 9/1994 Krauss et al. ............... 250/309
5,447,614 A 9/1995 Hamamura et al. .... 204/192.33

FOREIGN PATENT DOCUMENTS

EP 0 488 067 6/1992

* cited by examiner

*Primary Examiner*—Jack Berman
(74) *Attorney, Agent, or Firm*—Oblon, Spivak, McClelland, Maier & Neustadt, P.C.

(57) ABSTRACT

From an ion source and accelerator an ion beam is generated, this ion beam is let go through a circular hole bored in the center of a detector and orifices to irradiate a sample in a sample chamber. The detector detects particles scattered from the sample and arrived at the detector through the orifices. With exhaust units and orifices, the region surrounding the detector is exhausted to be a prescribed degree of vacuum of higher vacuum than the inside of the sample chamber.

12 Claims, 2 Drawing Sheets

ION SCATTERING SPECTROMETER

BACKGROUND OF THE INVENTION

1. Field of the Invention

The present invention relates to an ion scattering spectrometer in which an accelerated ion beam is bombarded on a sample and particles scattered from the sample are measured to analyze the sample, and in particular to an ion scattering spectrometer that enables to analyze a sample placed in a gas.

2. Description of the Related Art

So far, an ion scattering spectrometer is known in which an accelerated ion beam is bombarded onto a sample and particles scattered from the sample are detected to analyze the structure of the sample.

In addition, in such an ion scattering spectroscopy, a time-of-flight analysis method that measures the time-of-flight of the particles to analyze speed (energy) of the particles is known. Such a time-of-flight analysis method carries out energy analysis with the difference of arrival times of the particles scattered simultaneously from the sample. Accordingly, without depending on whether there is an electric charge or not with the particle, the energy analysis can be carried out.

The kind of detector being used in the ion scattering spectroscopy differs according to the energy or the like of the particles to be measured. In general, when particles of low energy (approximately several keV) or of medium energy (approximately several hundreds keV) are measured, a microchannel plate (MCP) is employed. Further, when particles of high energy (approximately several MeV) are measured, a semiconductor detector is employed.

In the aforementioned ion scattering spectrometer, the scattered ions of low energy or of medium energy can be measured with the microchannel plate (MCP) as a detector. In this case, in order to operate well a detector consisting of this microchannel plate (MCP), the surroundings of the detector is required to be a high vacuum of approximately $10^{-7}$ Torr or less. Further, even when a semiconductor detector capable of being used in a low vacuum (approximately 0.1 Torr) is employed, if a gas being used reacts with the detector, the surroundings of the detector is required to evacuate to a high vacuum. Accordingly, so far, the surroundings of a sample is also made a high vacuum according to this, and measurement of the sample is carried out under a high vacuum.

As described above, a conventional ion scattering spectrometer, in particular, an ion scattering spectrometer of low energy or medium energy analysis measures a sample under a high vacuum.

However, if an ion scattering spectroscopy method can be employed in analysis of a sample under a reduced atmospheric pressure (for example, approximately from $10^{-2}$ to $10^{-3}$ Torr) where a certain amount of gas exists, for example, in analysis of a state of a film during vapor-phase deposition or the like, an ion scattering spectrometer can be employed in monitoring a film during film formation. Thus, the range of application of the ion scattering spectrometer can be widened remarkably.

SUMMARY OF THE INVENTION

This invention is disclosed in Japanese Patent Application No. 10-151245 filed on Jun. 1, 1998, and the entire disclosure thereof is incorporated herein by reference.

An object of the present invention is to provide an ion scattering spectrometer that is capable of analyzing a sample placed in a gas atmosphere such as a gas for film formation.

In the present invention, an ion scattering spectrometer in which an ion beam generated at an ion source is accelerated by an accelerator to irradiate a sample placed in a sample chamber, and particles scattered from the sample are measured by a detector disposed at a prescribed position, comprises:

- a gas introducing means for introducing a prescribed gas into the sample chamber for treating the sample;
- a first exhaust means for exhausting the sample chamber to make the sample chamber an atmosphere of the prescribed gas of a prescribed reduced pressure;
- an orifice disposed between the sample chamber and the detector; and
- a second exhaust means for exhausting a neighbor of the detector to make the neighbor of the detector an atmosphere of a higher vacuum than the sample chamber.

Further, in the aforementioned ion scattering spectrometer of the present invention, the orifice comprises a first orifice disposed at the sample chamber side, and a second orifice disposed toward the detector side than the first orifice.

Still further, the aforementioned ion scattering spectrometer of the present invention comprises a third exhausting means for exhausting a region between the first orifice and the second orifice.

Further, in the aforementioned respective ion scattering spectrometers of the present invention, the detector is disposed at a prescribed distance apart from the sample and constituted to analyze the energy of the scattered particles.

Still further, in the aforementioned respective ion scattering spectrometers of the present invention, the gas introducing means is constituted to introduce a prescribed gas for film formation into the sample chamber and to form a prescribed film on the sample.

DETAILED DESCRIPTION OF PREFERRED EMBODIMENTS

In the following, the detail of an ion scattering spectrometer of the present invention will be described with embodiments in which the time-of-flight analysis method is employed in analysis of the speed (energy) of the particles, and with reference to drawings. Here, the time-of flight analysis method analyzes the energy of the particles due to the difference of the flight time of the particles that are scattered simultaneously.

Figure 1:
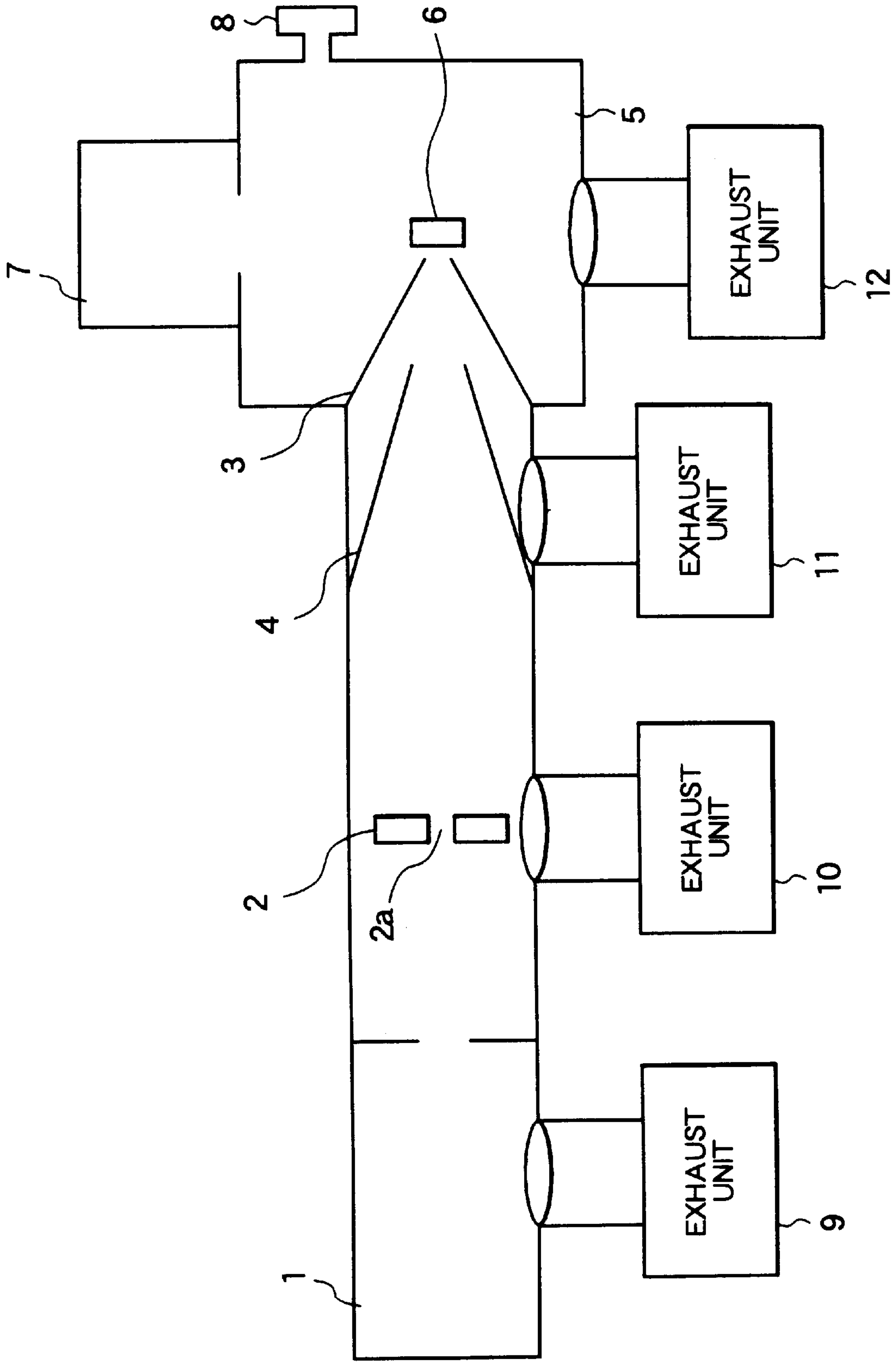
FIG. 1 is a diagram showing schematically an embodiment of the present invention.

FIG. 1 shows a schematic constitution of one embodiment of an ion scattering spectrometer of the present invention. In the figure, reference numeral 1 denotes an ion source and accelerator, reference numeral 2 denotes a detector, reference numerals 3 and 4 denote orifices, reference numeral 5 denotes a sample chamber, reference numeral 6 denotes a sample, reference numeral 7 denotes a gas feeding unit, reference numeral 8 denotes a vacuum gauge, and reference numerals 9 through 12 denote exhaust units.

The ion source and accelerator 1 generates prescribed ions at the ion source and accelerates the ions up to a prescribed energy to generate a pulse beam of ions of prescribed energy. The pulse beam of the ions goes past a circular hole 2*a* bored in the center of the detector 2 to irradiate the sample 6 in the sample chamber 5 through the orifices 4 and 3. Then, the particles scattered from the sample 6 and arrived at the detector 2 through the orifices 3 and 4 are detected by this detector 2.

Incidentally, the detector 2 is constituted of a microchannel plate (MCP).

In addition, the sample chamber 5 where the sample 6 is placed is fed with a prescribed gas to treat the sample 6 from a gas feeding unit 7, the prescribed gas being a prescribed vapor phase deposition gas in this example. Further, the inside of this sample chamber 5 can be exhausted by an exhaust unit 12 and made an atmosphere of a gas for vapor phase deposition of a prescribed pressure, for example, of approximately $10^{-2}$ Torr. Thereby, a prescribed vapor deposition film can be formed on the sample 6.

Further, among exhaust units 9 through 11, the exhaust unit 9 exhausts a region of an ion source and accelerator 1, the exhaust unit 10 a neighboring region of a detector 2, and the exhaust unit 11 a region between an orifice 3 and an orifice 4.

The first orifice 3 disposed at a sample 6 side has an aperture of a diameter of 2 mm (conductance: $3.6\times10^{-4}$ ($m^3/s$)) and the second orifice 4 disposed at a detector 2 side has an aperture of a diameter of 4 mm (conductance: $1.5\times10^{-3}$ ($m^3/s$)). In addition, the sample 6 is placed 3 mm apart from the aperture of the first orifice 3 and the aperture of the first orifice 3 is placed 50 mm apart from that of the second orifice 4. With such a setting, a region between the first orifice 3 and the second orifice 4 becomes a vacuum of approximately $7.2\times10^{-6}$ Torr, and a neighboring region of the detector 2 becomes a vacuum of approximately $2.2\times10^{-8}$ Torr. Further, the exhaust units that have exhaust capacity of 0.5 $m^3/s$ are employed.

Now, the aperture of the second orifice 4 is larger in diameter than that of the first orifice 3 so as to secure a solid angle seeing the detector 2 in proceeding direction of the scattered particles. Thereby, almost all of the particles scattered from the sample 6 in the proceeding direction and passed through the orifice 3 can reach the detector 2.

An ion scattering spectrometer of the above described constitution of this embodiment employs, for example, a silicon semiconductor wafer as the sample 6. The sample chamber 5, while being exhausted by an exhaust unit 12, is fed with a prescribed vapor deposition gas such as silane ($SiH_4$) from a vapor deposition gas feed unit 7. Thereby, the inside of the sample chamber 5 is made an atmosphere of a vapor deposition gas of a pressure of, for example, approximately $10^{-2}$ Torr to grow a layer of amorphous silicon on a sample 6 in vapor phase.

Then, with the exhaust units 9 through 11 the respective regions are exhausted to be the aforementioned degrees of vacuum. Thereafter, a pulse beam of ions generated at the ion source and accelerator 1 (of energy of approximately from several keV to several hundreds keV) is made to go past an aperture 2*a* disposed at the center of the detector 2 and to irradiate the sample 6 through the second orifice 4 and the first orifice 3.

The detector 2 detects particles scattered from the sample 6 and measures time-of-flight of the particles to analyze speed (energy) of the particles.

When taking, for example, a Si (100) surface, the umber of atoms in one monolayer is, $$1ML=2/5.431^2(\text{angstrom}^2)=6.8\times10^{14}(\text{atoms/cm}^2).$$

On the other hand, one mole (mol) of a gas has a volume of $22.4\times10^3$ ($cm^3$) under a pressure of 1 atmosphere (atm)

and room temperature (20° C.), and the number of molecules in one mole (mol) of a gas is $6.02\times10^{23}$. Therefore, under 1 atmosphere, in a unit volume of a gas, there are molecules of $$6.02\times10^{23}\ (\text{mol}^{-1})/22.4\times10^3\ (\text{cm}^3/\text{mol/atm})=2.68\times10^{19}(\text{cm}^{-3}\bullet\text{atm}^{-1}).$$

In the case of the sample 6 being placed 0.3 cm (3 mm)(working distance) apart from the aperture of the first orifice 3, taking this sectional area of the aperture of the orifice 3 as s, in a volume of 0.3 s ($cm^3$) of a pressure of $10^2$ Torr=$1.32\times10^{-5}$ (atm), there exist molecules of the number of $$0.3\ s\ (\text{cm}^3)\times2.68\times10^{-19}(\text{cm}^{-2}\bullet\text{atm}^{-1})\times1.32\times10^{-5}(\text{atm})=1.1\times s\times10^{-14}.$$

Accordingly, in a unit area, there exist molecules of $1.1\times10^{14}$ ($cm^{-2}$). This number of molecules is approximately one fifth of one monolayer of Si (100) surface.

Therefore, a scattering amount due to the gas is approximately one fifth of the atoms scattered from the surface of the sample 6. Thus, ion scattering spectroscopy of the sample 6 is made possible. Further, by taking the degree of vacuum and the kind of the gas into consideration, a scattering amount due to the gas can be evaluated. By subtracting this amount, a measurement can be carried out further correctly.

As described above, an ion scattering spectrometer of this embodiment can analyze a sample placed in a gas, that is, this spectrometer can carry out analysis of state of a film during vapor deposition.

Figure 2:
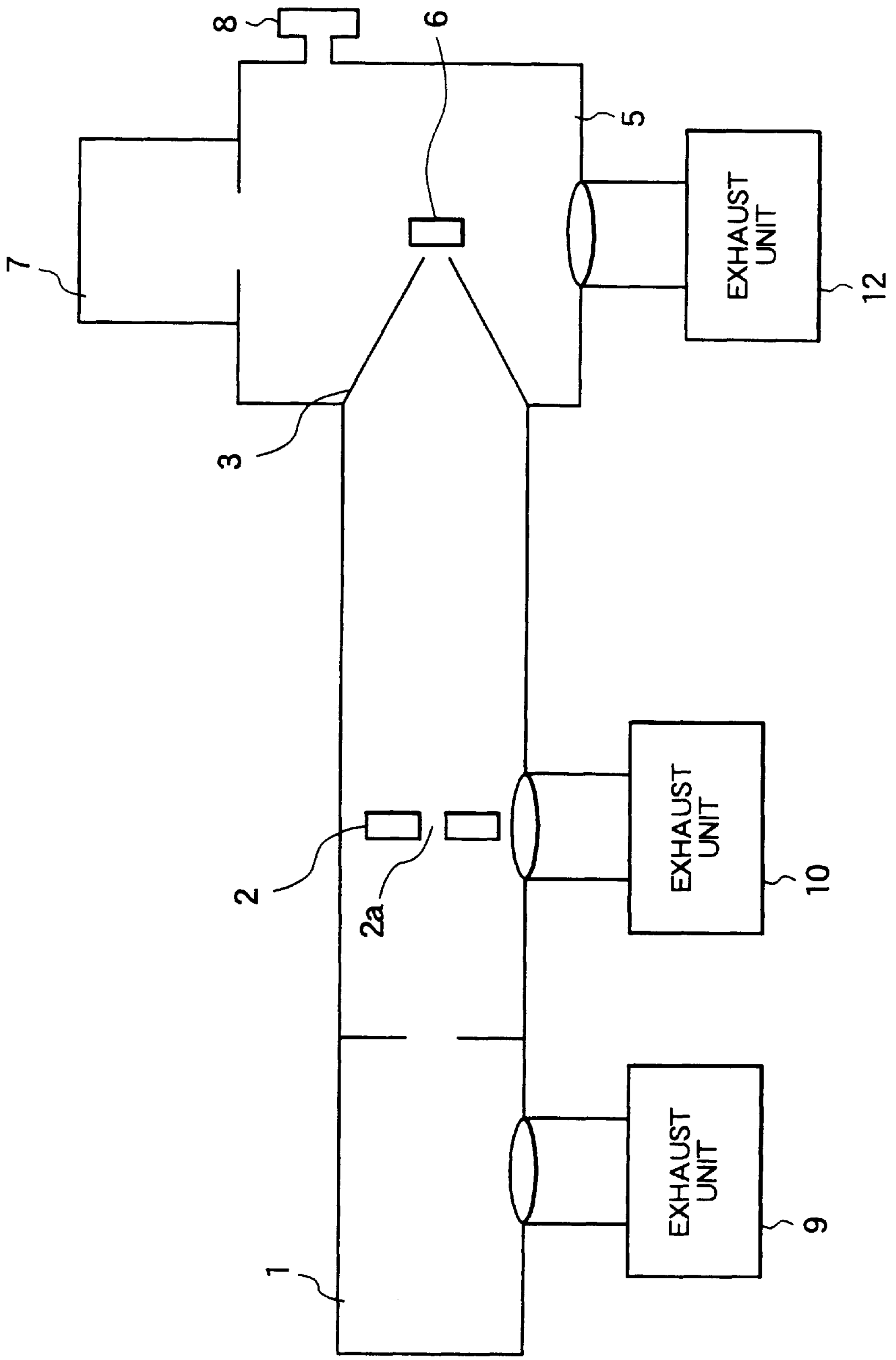
FIG. 2 is a diagram showing schematically another embodiment of the present invention.

FIG. 2 shows another embodiment of the present invention. In this embodiment, compared with the case of FIG. 1, only the first orifice 3 is employed and an exhaust unit 11 for exhausting the region between the orifices is omitted.

As shown in the embodiment, when the inside of the sample chamber 5 can be set at a higher vacuum than that necessary for the sample chamber 5, the second orifice and the exhaust unit for exhausting the region between the orifices can be omitted.

Incidentally, contrary to the above embodiments, in the present invention, the number of orifice can be increased to 3 or more stages. Further, the ion beam incident on the detector is not restricted only to go through the center of the detector but the detector can be disposed to detect ions of an arbitrary scattering angle. In addition, the present invention is not restricted to the above embodiments and various modifications can be applicable.

As described above, according to the present invention, an ion scattering spectrometer that can analyze a sample placed in a gas such as a vapor deposition gas is provided. Thereby, a state of a film during vapor deposition can be analyzed.

What is claimed is:

1. An ion scattering spectrometer in which an ion beam generated at an ion source is accelerated by an accelerator to irradiate a sample placed in a sample chamber, and particles scattered from the sample are measured by a detector, the spectrometer comprising:

gas introducing means for introducing a gas into the sample chamber for treating the sample;

first exhaust means for exhausting the sample chamber to make in the sample chamber, an atmosphere of the gas of a reduced pressure;

an orifice disposed between the sample chamber and the detector to separate a first region including the detector from the sample chamber, the orifice passing both the ion beam that irradiates the sample and the particles that are scattered from the irradiated sample to reach the detector; and second exhaust means for exhausting the first region to make the first region have a higher vacuum than a vacuum of the sample chamber;

wherein:

the detector includes a center hole for passing the ion beam toward the sample; and the detector's center hole, the orifice, and the sample are aligned such that the ion beam that is irradiated toward the sample, and the scattered particles that are scattered from the sample, have a same axis.

2. The ion scattering spectrometer as set forth in claim 1:

wherein the gas introducing means is constituted to introduce a prescribed vapor deposition gas into the sample chamber and to form a prescribed film on the sample.

3. The ion scattering spectrometer as set forth in claim 1:

wherein the detector is disposed at a prescribed distance apart from the sample to analyze energy of the scattering particles.

4. The ion scattering spectrometer as set forth in claim 3:

wherein the gas introducing means is constituted to introduce a prescribed vapor deposition gas into the sample chamber and to form a prescribed film on the sample.

5. An ion scattering spectrometer in which an ion beam generated at an ion source is accelerated by an accelerator to irradiate a sample placed in a sample chamber, and particles scattered from the sample are measured by a detector, the spectrometer comprising:

gas introducing means for introducing a gas into the sample chamber for treating the sample;

first exhaust means for exhausting the sample chamber to make in the sample chamber, an atmosphere of the gas of a reduced pressure;

at least first and second orifices disposed between the sample chamber and the detector, the first orifice disposed at a sample chamber side and the second orifice disposed at a detector side to separate the detector from the sample chamber, and to define a first region between the detector and the second orifice and a second region between the first orifice and the second orifice, the first and second orifices passing both the ion beam that irradiates the sample and the particles that are scattered from the irradiated sample to reach the detector; and second exhaust means for exhausting the first region to make the first region have a higher vacuum than a vacuum of the sample chamber;

wherein:

the detector includes a center hole configured to pass the ion beam toward the sample; and the detector's center hole, the first and second orifices, and the sample are aligned such that the ion beam that is irradiated toward the sample, and the scattered particles that are scattered from the sample, have a same axis.

6. The ion scattering spectrometer as set forth in claims 5:

wherein the gas introducing means is constituted to introduce a prescribed vapor deposition gas into the sample chamber and to form a prescribed film on the sample.

7. The ion scattering spectrometer as set forth in claim 5:

wherein the detector is disposed at a prescribed distance apart from the sample to analyze energy of the scattering particles.

8. The ion scattering spectrometer as set forth in claim 7:

wherein the gas introducing means is constituted to introduce a prescribed vapor deposition gas into the sample chamber and to form a prescribed film on the sample.

9. An ion scattering spectrometer in which an ion beam generated at an ion source is accelerated by an accelerator to irradiate a sample placed in a sample chamber, and particles scattered from the sample are measured by a detector, the spectrometer comprising:

gas introducing means for introducing a gas into the sample chamber for treating the sample;

first exhaust means for exhausting the sample chamber to make in the sample chamber, an atmosphere of the gas of a reduced pressure;

at least first and second orifices disposed between the sample chamber and the detector, the first orifice disposed at a sample chamber side and the second orifice disposed at a detector side to separate the detector from the sample chamber, and to define a first region between the detector and the second orifice and a second region between the first orifice and the second orifice, the first and second orifices passing both the ion beam that irradiates the sample and the particles that are scattered from the irradiated sample to reach the detector;

second exhaust means for exhausting the first region to make the first region have a higher vacuum than a vacuum of the sample chamber; and third exhaust means for exhausting the second region;

wherein:

the detector includes a center hole configured to pass the ion beam toward the sample; and the detector's center hole, the first and second orifices, and the sample are aligned such that the ion beam that is irradiated toward the sample, and the scattered particles that are scattered from the sample, have a same axis.

10. The ion scattering spectrometer as set forth in claim 9:

wherein the gas introducing means is constituted to introduce a prescribed vapor deposition gas into the sample chamber and to form a prescribed film on the sample.

11. The ion scattering spectrometer as set forth in claim 9:

wherein the detector is disposed at a prescribed distance apart from the sample to analyze energy of the scattered particles.

12. The ion scattering spectrometer as set forth in claim 11:

wherein the gas introducing means is constituted to introduce a prescribed vapor deposition gas into the sample chamber and to form a prescribed film on the sample.

* * * * *